US011509303B2

(12) United States Patent
Bai et al.

(10) Patent No.: US 11,509,303 B2
(45) Date of Patent: Nov. 22, 2022

(54) GLITCH POWER ANALYSIS AND OPTIMIZATION ENGINE

(71) Applicant: Siemens Industry Software Inc., Plano, TX (US)

(72) Inventors: Geng Bai, ShenZhen (CN); Ping-San Tzeng, Fremont, CA (US); Chao-Yung Wang, Taipei (TW); Yang Wu, Los Altos Hills, CA (US); Wen Kung Chu, San Jose, CA (US)

(73) Assignee: Siemens Industry Software Inc., Plano, TX (US)

( * ) Notice: Subject to any disclaimer, the term of this patent is extended or adjusted under 35 U.S.C. 154(b) by 324 days.

(21) Appl. No.: 16/915,099

(22) Filed: Jun. 29, 2020

(65) Prior Publication Data

US 2021/0384901 A1 Dec. 9, 2021

(51) Int. Cl.
*H03K 17/687* (2006.01)
*G01R 31/317* (2006.01)
*G01R 31/00* (2006.01)

(52) U.S. Cl.
CPC ........... *H03K 17/687* (2013.01); *G01R 31/00* (2013.01); *G01R 31/31718* (2013.01)

(58) Field of Classification Search
None
See application file for complete search history.

(56) References Cited

U.S. PATENT DOCUMENTS

| 6,016,066 | A  | * | 1/2000  | Ilkbahar | G11C 7/1078 327/23 |
| 7,372,304 | B2 | * | 5/2008  | Fruhauf  | G01R 31/31719 326/46 |
| 11,361,137 | B2 | * | 6/2022  | Wu       | G06F 30/337 |
| 2008/0281574 | A1 | * | 11/2008 | Bazinet | G06F 30/33 703/18 |

FOREIGN PATENT DOCUMENTS

KR 20010098552 A * 11/2001 ....... G01R 31/31922

OTHER PUBLICATIONS

Hashimoto et al., "A Practical Gate Resizing Technique Considering Glitch Reduction for Low Power Design", Proceedings of the 36th annual Design Automation Conference, Jun. 1999.

(Continued)

*Primary Examiner* — Jermele M Hollington

(57) ABSTRACT

A switching activity report of simulated switching activities of a semiconductor circuit is accessed. A plurality of glitch bottleneck ratios corresponding to a plurality of pins in the semiconductor circuit are determined, comprising by: setting an initial bottleneck ratio on a leaf output pin; and backward traversing the semiconductor circuit to determine a plurality of glitch bottleneck ratios of pins in a fan-in cone of the leaf output pin.
A plurality of total glitch powers associated with the plurality of pins is determined, a total glitch power of the plurality of total glitch powers being determined based on a glitch bottleneck ratio and a glitch power of a corresponding pin. One or more critical bottleneck pins among the plurality (Continued)

of pins are identified based on the plurality of total glitch powers. One or more gates associated with the one or more critical bottleneck pins are adjusted to reduce corresponding one or more total glitch powers of the one or more gates.

20 Claims, 12 Drawing Sheets

(56) References Cited

OTHER PUBLICATIONS

Lim et al., "Statistical Estimation of Delay-Dependent Switching Activities in Embedded CMOS Combinational Circuits", IEEE Trans. on Very Large Scale Integration (VLSI) Systems, vol. 5, No. 3, Sep. 1997.

Sayed et al., "A New Statistical Approach for Glitch Estimation in Combinational Circuits", IEEE Internal Symposium on Circuits and Systems, May 2007.

* cited by examiner

GLITCH POWER ANALYSIS AND OPTIMIZATION ENGINE

CROSS REFERENCE TO OTHER APPLICATIONS

This application claims priority to U.S. Provisional Patent Application No. 63/034,189 entitled GLITCH POWER ANALYSIS AND OPTIMIZATION ENGINE filed Jun. 3, 2020 which is incorporated herein by reference for all purposes.

BACKGROUND OF THE INVENTION

The advent of FinFET (Fin Field-Effect Transistor) technology has greatly reduced circuit leakage power as an improvement. Circuit total power consumption is thus more driven by "dynamic power", where is referred to herein as the power consumed while the circuit components like logic gates are active, for example during a rise or fall transition. It would be useful to focus analysis and optimization on reducing dynamic power during circuit design and implementation to, for example, improve battery life, reduce heat and/or thermal noise, improve power efficiency, reduce power requirements, and reduce weight/size of products associated with said circuit.

BRIEF DESCRIPTION OF THE DRAWINGS

Various embodiments of the invention are disclosed in the following detailed description and the accompanying drawings.

DETAILED DESCRIPTION

Figure 1:
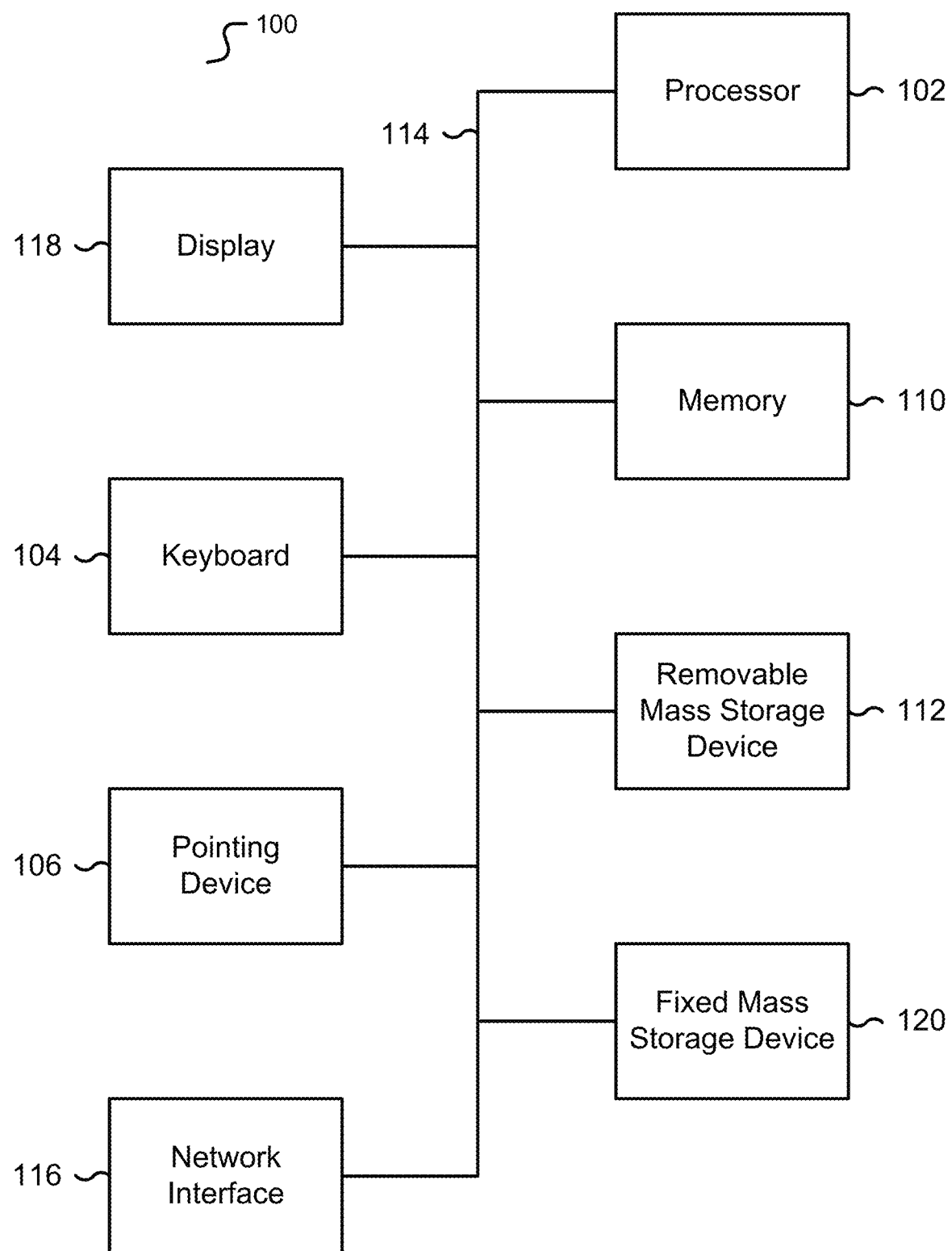
FIG. 1 is a functional diagram illustrating a programmed computer/server system for glitch power analysis and/or optimization in accordance with some embodiments.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

To achieve low power design, a design and implementation tool such as a place and route (P&R) tool may consider dynamic power during its optimization flow. As logic gates and interconnect wire have non-zero delay, logic gates may have multiple toggles before they reach steady logic state in each clock cycle. The dynamic power triggered by these non-functional toggles are referred to herein as "glitch power". Using analysis of glitch power to optimize circuit design and implementation is disclosed.

Circuit glitch power varies with input patterns. To get accurate toggle information for all the logic gates in a circuit, typically millions of simulation cycles using different input patterns are needed for analysis, for example using a dynamic simulation, and saved to a file, for example a VCD (Value Change Dump) file. A VCD is an ASCII-based format for dumpfiles generated by design tools, and is defined in IEEE Standard 1364-1995 and IEEE Standard 1364-2001. In alternate embodiments, a FSDB (Fast Signal Database), WLF (Wave Log File), SHM (Stimulus File), VPD (binary value dump), SAIF (Switching Activity Interface Format) file, or any signal/switching activity report may be used without limitation. A signoff power analysis tool may read in a VCD file or other file to do glitch power analysis Due to this long simulation time, this type of traditional glitch power analysis is time consuming. Furthermore, traditionally there has been no incremental update capability; that is, if a designer changes any part of the design, they have to repeat the entire the process to find a new glitch power value of the design. Because of the constant changes in an implementation flow like a P&R flow, traditional glitch power analysis is impractical for these flows and so traditional circuits designed by such tools are not dynamic power optimized. A signoff glitch power analysis flow may include:

dynamic gate-level simulation, for example VCS or NCSIM, to generate zero and non-zero delay SAIF files;

using a single non-zero delay VCD file is sufficient to extract a glitch toggle rate per instance/gate; and/or a power analysis tool reads the VCD file, SAIF file, or other signal/switching report to perform dynamic, functional, and/or glitch power analysis.

Another traditional approach is a statistical approach for quick glitch power analysis. While the traditional approach does not require a time-consuming dynamic simulation, this statistical approach does not consider logic correlation in the circuit, and results may be different from a real glitch power value. Using such a model directly in an implementation/P&R flow, while practical in speed, may produce random and/or unpredictable glitch power in the final design which does not optimize well or may even be counterproductive. A statistical glitch power estimation flow may be less accurate but fast, reveal physical information on glitch power reduction techniques, and easier to adopt into implementation/P&R flows.

FIG. 1 is a functional diagram illustrating a programmed computer/server system for glitch power analysis and/or optimization in accordance with some embodiments. As shown, FIG. 1 provides a functional diagram of a general purpose computer system programmed to provide glitch power analysis and/or optimization in accordance with some embodiments. As will be apparent, other computer system architectures and configurations may be used for glitch power analysis and/or optimization.

Computer system 100, which includes various subsystems as described below, includes at least one microprocessor subsystem, also referred to as a processor or a central processing unit ("CPU") (102). For example, processor (102) can be implemented by a single-chip processor or by multiple cores and/or processors. In some embodiments, processor (102) is a general purpose digital processor that controls the operation of the computer system 100. Using instructions retrieved from memory (110), the processor (102) controls the reception and manipulation of input data, and the output and display of data on output devices, for example display and graphics processing unit (GPU) (118).

Processor (102) is coupled bi-directionally with memory (110), which can include a first primary storage, typically a random-access memory ("RAM"), and a second primary storage area, typically a read-only memory ("ROM"). As is well known in the art, primary storage can be used as a general storage area and as scratch-pad memory, and can also be used to store input data and processed data. Primary storage can also store programming instructions and data, in the form of data objects and text objects, in addition to other data and instructions for processes operating on processor (102). Also as well known in the art, primary storage typically includes basic operating instructions, program code, data, and objects used by the processor (102) to perform its functions, for example programmed instructions. For example, primary storage devices (110) can include any suitable computer-readable storage media, described below, depending on whether, for example, data access needs to be bi-directional or uni-directional. For example, processor (102) can also directly and very rapidly retrieve and store frequently needed data in a cache memory, not shown. The processor (102) may also include a coprocessor (not shown) as a supplemental processing component to aid the processor and/or memory (110).

A removable mass storage device (112) provides additional data storage capacity for the computer system 100, and is coupled either bi-directionally (read/write) or uni-directionally (read only) to processor (102). For example, storage (112) can also include computer-readable media such as flash memory, portable mass storage devices, holographic storage devices, magnetic devices, magneto-optical devices, optical devices, and other storage devices. A fixed mass storage (120) can also, for example, provide additional data storage capacity. One example of mass storage (120) is an eMMC or microSD device. In one embodiment, mass storage (120) is a solid-state drive connected by a bus (114). Mass storage (112), (120) generally store additional programming instructions, data, and the like that typically are not in active use by the processor (102). It will be appreciated that the information retained within mass storage (112), (120) can be incorporated, if needed, in standard fashion as part of primary storage (110), for example RAM, as virtual memory.

In addition to providing processor (102) access to storage subsystems, bus (114) can be used to provide access to other subsystems and devices as well. As shown, these can include a display monitor (118), a communication interface (116), a touch (or physical) keyboard (104), and one or more auxiliary input/output devices (106) including an audio interface, a sound card, microphone, audio port, audio recording device, audio card, speakers, a touch (or pointing) device, and/or other subsystems as needed. Besides a touch screen and/or capacitive touch interface, the auxiliary device (106) can be a mouse, stylus, track ball, or tablet, and is useful for interacting with a graphical user interface.

The communication interface (116) allows processor (102) to be coupled to another computer, computer network, or telecommunications network using a network connection as shown. For example, through the communication interface (116), the processor (102) can receive information, for example data objects or program instructions, from another network, or output information to another network in the course of performing method/process steps. Information, often represented as a sequence of instructions to be executed on a processor, can be received from and outputted to another network. An interface card or similar device and appropriate software implemented by, for example executed/performed on, processor (102) can be used to connect the computer system 100 to an external network and transfer data according to standard protocols. For example, various process embodiments disclosed herein can be executed on processor (102), or can be performed across a network such as the Internet, intranet networks, or local area networks, in conjunction with a remote processor that shares a portion of the processing. Throughout this specification "network" refers to any interconnection between computer components including the Internet, Bluetooth, WiFi, 3G, 4G, 4GLTE, GSM, Ethernet, TCP/IP, intranet, local-area network ("LAN"), home-area network ("HAN"), serial connection, parallel connection, wide-area network ("WAN"), Fibre Channel, PCI/PCI-X, AGP, VLbus, PCI Express, Expresscard, Infiniband, ACCESS.bus, Wireless LAN, HomePNA, Optical Fibre, G.hn, infrared network, satellite network, microwave network, cellular network, virtual private network ("VPN"), Universal Serial Bus ("USB"), FireWire, Serial ATA, 1-Wire, UNI/O, or any form of connecting homogenous, heterogeneous systems and/or groups of systems together. Additional mass storage devices, not shown, can also be connected to processor (102) through communication interface (116).

An auxiliary I/O device interface, not shown, can be used in conjunction with computer system 100. The auxiliary I/O device interface can include general and customized interfaces that allow the processor (102) to send and, more typically, receive data from other devices such as microphones, touch-sensitive displays, transducer card readers, tape readers, voice or handwriting recognizers, biometrics readers, cameras, portable mass storage devices, and other computers.

In addition, various embodiments disclosed herein further relate to computer storage products with a computer readable medium that includes program code for performing various computer-implemented operations. The computer-readable medium is any data storage device that can store data which can thereafter be read by a computer system. Examples of computer-readable media include, but are not limited to, all the media mentioned above: flash media such as NAND flash, eMMC, SD, compact flash; magnetic media such as hard disks, floppy disks, and magnetic tape; optical media such as CD-ROM disks; magneto-optical media such as optical disks; and specially configured hardware devices such as application-specific integrated circuits ("ASIC"s), programmable logic devices ("PLD"s), and ROM and RAM devices. Examples of program code include both machine code, as produced, for example, by a compiler, or files containing higher level code, for example a script, that can be executed using an interpreter.

The computer/server system shown in FIG. 1 is but an example of a computer system suitable for use with the various embodiments disclosed herein. Other computer systems suitable for such use can include additional or fewer subsystems. In addition, bus (114) is illustrative of any interconnection scheme serving to link the subsystems. Other computer architectures having different configurations of subsystems may also be utilized.

Figure 2:
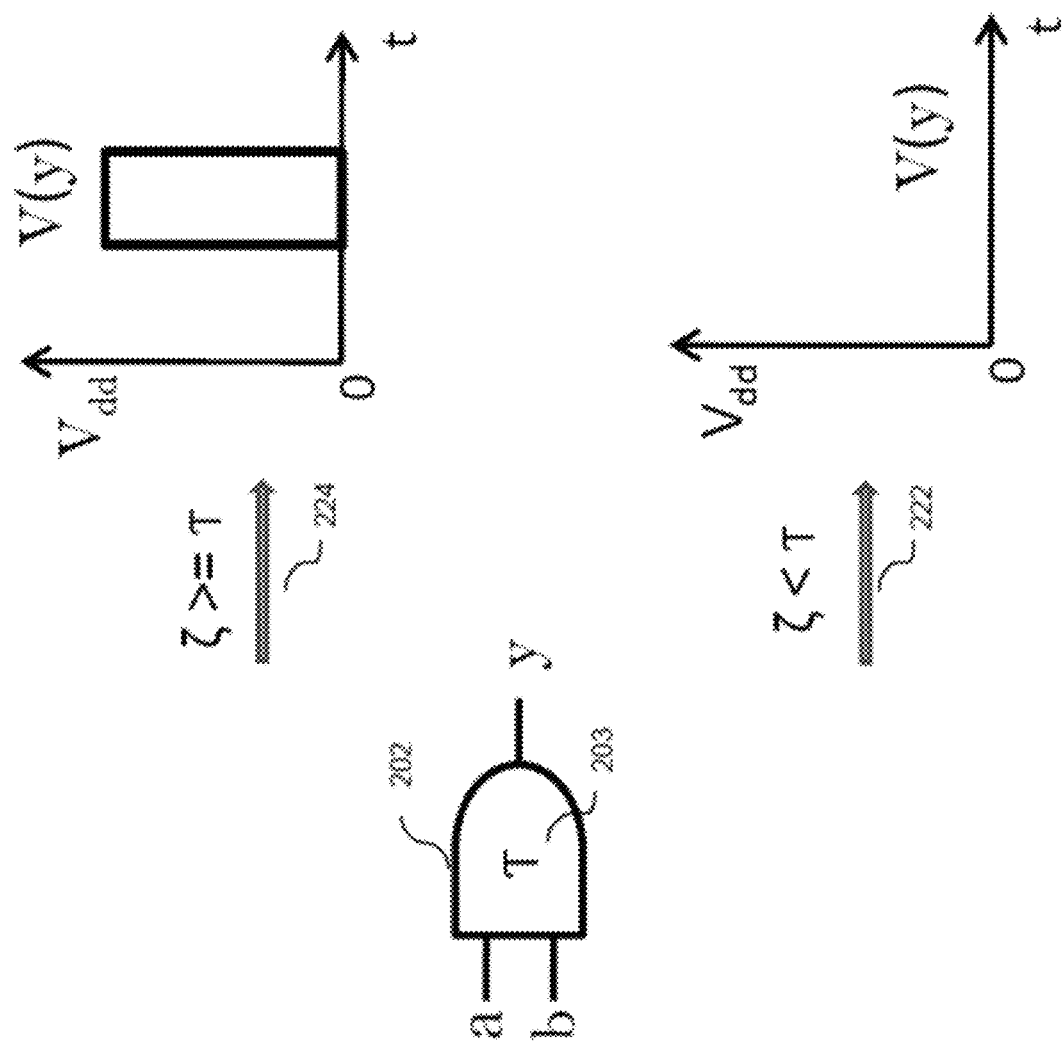
FIG. 2 is an illustration of a generated glitch example.
Figure 2:
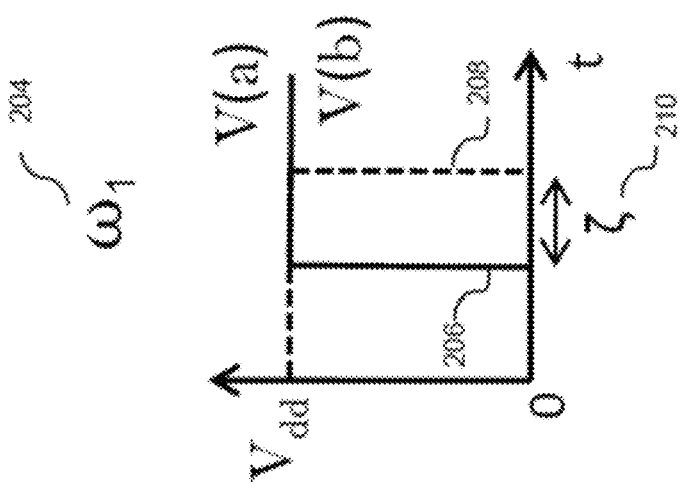

FIG. 2 is an illustration of a generated glitch example. Logic gate (202) is shown here as an illustrative example to be a two-input AND gate with inputs a and b, output y, and with cell delay of value $\tau$ (203) from an input pin a to output pin y. For an input pattern $\omega_1$ (204), the input for pin a is shown as voltage V(a) (206) as a function of time with a rising edge, the input for pin b is shown as voltage V(b)(208) as a function of time with a falling edge, and with the interval time between the two edges as $\zeta$ (210).

A "generated glitch" as referred to herein are glitches generated by functional transitions. The two conditions associated with a generated glitch include that: first, the input pattern is a pattern $\omega_k$ that may cause glitches at output; and second, the interval time $\zeta$ between successive transitions at different inputs is larger than cell delay $\tau$.

As shown in FIG. 2, if $\zeta<\tau$ (222), no glitch occurs at the output V(y). Alternately, if $\zeta>\tau$ (224), a glitch occurs at the output of V(y) of width $\zeta$. Thus, as illustrated in FIG. 2 reducing generated glitches may be addressed by reducing interval time $\zeta$ and/or increasing cell delay $\tau$ by slowing down the cell.

Dual Glitch Power Analysis Engine. A dual glitch power analysis engine is disclosed. A dual glitch power analysis engine calculates accurate glitch power value and incrementally updates design glitch power during an implementation/P&R flow.

In one embodiment, the dual glitch power analysis engine comprises two engines which run and have as input a VCD file. One of the two engines is an annotation engine which extracts information from the VCD file and annotates accurate glitch toggle information from the dynamic simulation that produced the VCD file. The other of the two engines is a statistical engine which uses boundary pin toggling information. Boundary pins are the input pins and output pins of registers and comprise a small portion of the design.

The annotation engine is configured to extract the number of annotated glitches, $TG_{anno}$, for each instance from VCD file and then calculating an accurate glitch power. The statistical engine estimates the number of statistical glitches, $TG_{stat}$, for each instance and glitch power based on the statistical approach for quick glitch power analysis. In one embodiment, further enhancements disclosed herein improve statistical engine accuracy.

The initial calibration ratios between annotated glitch toggle counts and statistical glitch toggle counts are recorded for each instance and/or logic gate in the design:

$$TG\_AdjRatio = \frac{TG_{anno}}{TG_{stat}}$$

After applying this calibration ratio, the initial glitch power from the two engines is similar.

During an implementation/P&R glitch power optimization flow, the number of glitch toggles for each instance may be updated quickly using the statistical glitch analysis engine. After the update, TG_AdjRatio is applied to determine a revised glitch number and glitch power in the design.

Figure 3:
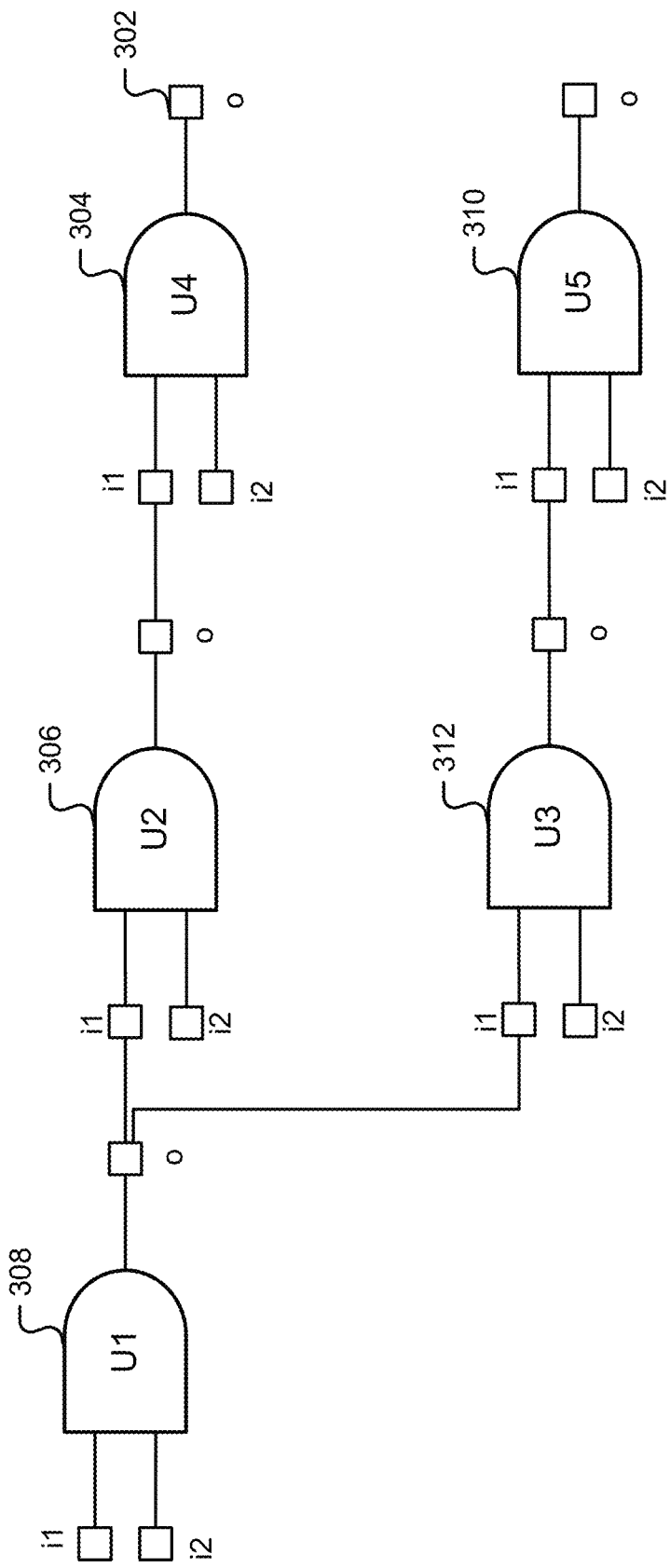
FIG. 3 is an illustration of a glitch bottleneck example.

FIG. 3 is an illustration of a glitch bottleneck example. The glitch bottleneck ratio is used to identify glitch bottleneck pins. Determining glitch power efficiently comprises identifying glitch bottleneck pins. Before identifying glitch bottleneck pins, the bottleneck ratio is calculated for every pin.

The bottleneck ratio on a leaf output pin, for example pin (302) at the output of gate U4 (304), is set as 1. As described in greater detail below, the circuit is then backward traversed to calculate the bottleneck ratios for other pins in the fan-in cone, which as shown in FIG. 3 includes pins associated with gate U2 (306) and U1 (308). In one embodiment, in an analysis engine a circuit is abstracted into a directed graph. The logic gate input/output pins are represented as vertices in the graph. The timing arc from input to output pin in the same logic gate or the connection from one logic gate output to the other logic gate input are represented as edges in the graph. In order to traverse the graph, a starting vertex and ending vertex may be defined. Typical starting vertices include: primary input ports and/or sequential logic gate output pins (e.g. flip-flop Q pins). Typical ending vertices include: primary output ports and/or sequential logic gate inputs (e.g. flip-flop D pins). As described herein, backward traversal is traversing this directed graph from ending vertices to input vertices.

Ratio BN(i) is defined as the bottleneck ratio on pin i. The bottleneck ratio of an input pin a is represented as:

$$BN(a) = P\left(\frac{\partial F}{\partial a}\right) * BN(o)$$

where F is the output function of a cell, P($\partial F/\partial a$) is the probability of the Boolean difference, and BN(o) is the bottleneck ratio of output pin. The value of the Boolean difference reflects the fact of change of the function F with respect to one of its variable a; the Boolean difference is equal to 1 if such change occurs, and is equal to 0 otherwise.

The bottleneck ratio of an output pin is 1 plus its total bottleneck ratio on sink pins. In the example of FIG. 3, the bottleneck ratios for U4_o and U5_o, the output pin of gates U4 (304) and U5 (310) respectively, are 1 since they are the leaf pins in this simple example:

$$BN(U4\_o)=1$$

$$BN(U5\_o)=1$$

and the bottleneck ratio of the other output pins for U1_o, U2_o, and U3_o, the output pin of gates U1 (308), U2 (306), and U3 (312) respectively, are:

$$BN(U1\_o)=1+BN(U2\_a)+BN(U3\_a)$$

$$BN(U2\_o)=1+BN(U4\_a)$$

$$BN(U3\_o)=1+BN(U5\_a)$$

After all bottleneck ratios are calculated, the critical bottleneck pins may be found by multiplying the bottleneck ratio for a given pin with its generated glitch power or propagated glitch power, as described in greater detail below. The total glitch power propagated to its fanout Ptotal may be represented as follows.

$$Ptotal(o)=BN(o)*Pglitch(o)$$

where Pglitch(o) is the glitch power on pin o and BN(o) is the bottleneck ratio on pin o. The most critical bottleneck pin may be found by sorting Ptotal.

Using a glitch bottleneck is disclosed, for example, for each instance output pin. This results in the total glitch toggles caused by the pin in its fanout cone. With the disclosed dual glitch power analysis, implementation/P&R optimization may focus on high glitch bottleneck pins to reduce the design glitch power effectively.

Figure 4:
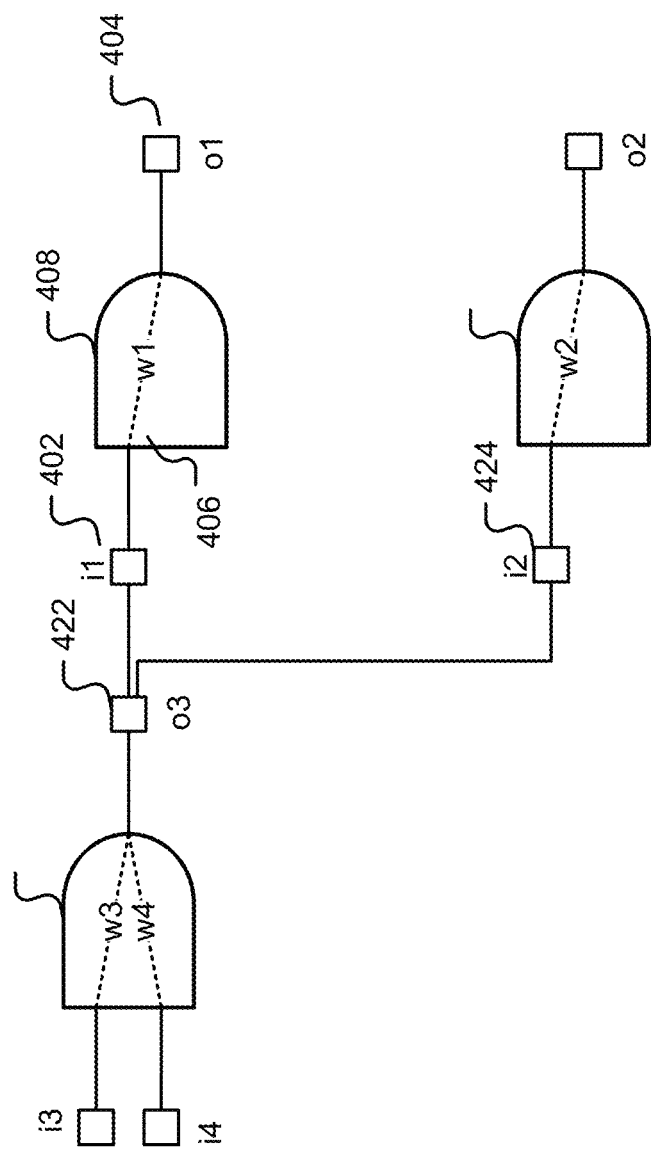
FIG. 4 is an illustration of a glitch power bottleneck calculation using a statistical glitch power analysis.

FIG. 4 is an illustration of a glitch power bottleneck calculation using a statistical glitch power analysis. As described above, the pin glitch power bottleneck ratio of a pin may be expressed as the total glitch toggle rate at the pin propagated to its fanout. Thus, an approximate glitch power bottleneck is the bottleneck ratio multiplied by the pin glitch power. The bottleneck ratio of the whole design may be calculated using a one forward depth-first traverse.

For example, if $w_i$ is a glitch toggle propagation rate calculated during statistical glitch power analysis, then referring to FIG. 4 the bottleneck ratio for input pin i1 (402) of gate (408) is $$BN(i1)=BN(o1)\times w_1$$

where o1 is the output pin (404) of gate (408), and $w_1$ is the glitch toggle propagation ratefor arc i1 to o1 (406) calculated during statistical glitch power analysis. Similarly:

$$BN(i2)=BN(o2)\times w_2$$

$$BN(i3)=BN(o3)\times w_3$$

$$BN(i4)=BN(o4)\times w_4$$

As before, the bottleneck ratio for output pin o3 (422) is equal to 1 added to the bottleneck ratio for input pins i1 (402) and i2 (424):

$$BN(o3)=1+BN(i1)+BN(i2).$$

Generally, $$R(yi) = P\left(\frac{\partial y}{\partial x_i}\right)\prod_{j!=i}(1 - \beta \times \text{Tog\_Rate}(x_j))$$

Here the $$\frac{\partial y}{\partial x_i}$$

term is the Boolean difference of Boolean function y related to it's i-th variable $x_i$. The $$P\left(\frac{\partial y}{\partial x_i}\right)$$

term represents me probability of the Boolean difference to have value 1. The $\Pi_{j!=i}(1-\beta \times \text{Tog\_Rate}(x_j))$ term multiplies all of $(1-\beta \times \text{Tog\_Rate}(x_j))$ together where $x_j$ the j-th variable of y and j is any variable in the variable list but i.

Figure 5:
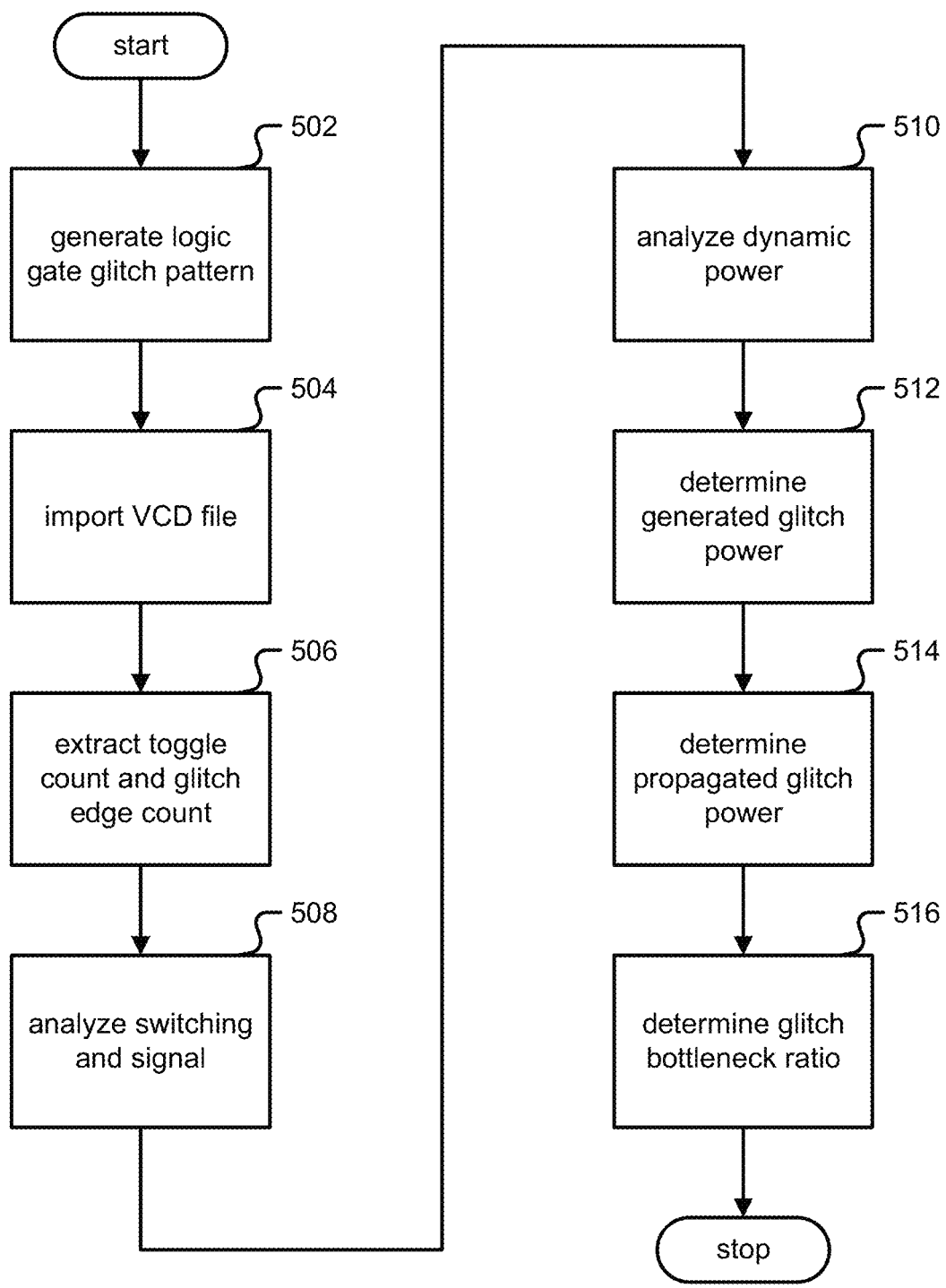
FIG. 5 is a flow chart illustrating an embodiment of a process for dynamic power analysis.

FIG. 5 is a flow chart illustrating an embodiment of a process for dynamic power analysis. In one embodiment, the process of FIG. 5 is carried out by the system of FIG. 1.

In step (502), a logic gate glitch pattern is generated. That is, the input patterns that may cause a glitch at each logic gate output in the design are characterized. For example, a class definition for such an input pattern may be:

```
class powGlitchPattern
{
dbLibPin*        _oPin;           // output pin with glitch
dbLibPin*        _leadPin;        // Input pin with leading edge
dbLibPin*        _tailPin;        // Input pin with tailing edge
bool             _leadEdgeFall;   // Leading edge polarity
bool             _tailEdgeFall;   // Tailing edge polarity
                                  // 0 Rise 1 Fall
DdNode*          _biasCondition;  // Bias condition BoolTree
powGlitchPattern* _next;          // Next glitch input pattern
};
with generation being executed as:
foreach inCell arc (input: inP1) that trigger R at outP {
   collect inP pointer into array1;
   also record inP toggle (R/F) into toggleArr1;
}
foreach inCell arc (input: inP2) that trigger F at outP {
   collect inP2 pointer into array2;
   also record inP2 toggle (R/F) into toggleArr2;
}
foreach inP1 in arrag1 {
  foreach inP2 in arragZ {
    if (inP1 == inP2) continue;
    // following code need decide which input can be the leading edge
    if (toggleArr1 [inP1] == R && toggleArr2 [inP1] = R) {
      // assuming inP1 lead. in temporal domain.
      // the input logic combination for
      // inP1/inP is 00, 10, 11
      Eval BoolTree of output pin:
         val1 = outP_Bool (inP1 == 0. inP2 == 0) ;
      Eval BoolTree of output pin:
         val2 = outP_Bool (inP1 == 1. inP2 == 0) ;
      Eval BoolTree of output pin:
         val3 = outP_Bool (inP1 == 1. inP2 == 1) ;
      if (val1 == val3 && val1 != val2) then
         inP1 lead, inP2 tail is valid pattern;
      // assuming inP1 tail, inP2 lead. then
      // the input logic is: 00, 01. 11
      Eval BoolTree of output pin:
         val4 2 outP_Bool (inP1 == 0. inP2 == 1) ;
      if (val1 == val3 && val1 != val4) then
         inP1 tail, inP2 lead is valid pattern;
    }
    else if (toggleArr1 [inP1] == R && toggleArr2 [inP1] == F) {
      // similar
    }
    else if (toggleArr1 [inP1] == F & toggleArr2 [inP1] == R) {
      // similar
    }else { // (toggleArr1 [inP1] == F && toggleArr2 [inP1] == F)
      // similar
    }
  }
}
```

The generated logic gate glitch pattern may be used, for example, in step (512) as part of determining generated glitch power.

In step (504), a signal/switching activity report is accessed. In one embodiment, the signal/switching activity report is imported from a VCD file. Other data formats and access can be used in other embodiments. In step (506), the total toggle count (TC) and the number of glitch edges ($TG_{anno}$) for each instance/gate are extracted from the imported VCD file:

$$TC = TC_{func} + TG_{anno}$$

Wherein $TC_{func}$ is a functional toggle count at each instance. During a power optimization flow, this number may be constant.

In step (508), switching activity and signal probability are calculated based on information from the signal/switching activity report, for example a VCD file. In one embodiment, if toggle information is missing in VCD for any instance, the tool propagates switching activity and signal probability to fill-in missing information. The total toggle count per time duration is its switching activity, wherein the time duration for each pin when its logic is one is its signal probability.

Expressed in terms of functions, the signal probability $P(x)$ is the average fraction of clock cycles in which the steady state value of the node x is a logic high:

$$P(x) = \lim_{k \to \infty} \frac{1}{k} \sum_{n=0}^{k} x[n]$$

If a logic signal $x(t)$ makes $n_x(t)$ transitions in a time intervals of length T, then the switching activity of $x(t)$, $D(x)$ is:

$$D(x) = \lim_{T \to \infty} \frac{n_x(t)}{T} = \lim_{k \to \infty} \frac{1}{kT} \sum_{n=1}^{k} |x[n] - x[n-1]|$$

In terms of switching activity propagation, if the inputs $x_i$ to a Boolean module are spatially independent, then the switching activity of its output y is given by:

$$D(y) = \sum_{i=1}^{n} P\left(\frac{\partial y}{\partial x_i}\right) D(x_i) \quad (1)$$

In step (510), dynamic power is analyzed. In terms of signal probability and switching activity annotation and propagation, the dynamic power is a function of the sum of switching power and internal power.

In order to correlate switching and internal power with signoff results, the signal probability and switching activity may be annotated from the VCD file of step (504). The toggle activity may be extracted, for example by using a command. As described above, for a net whose signal probability and switching activity annotation are still missing after annotation, the AP (the computing engine) may perform signal probability and switching activity propagation using the function in equation (1).

In an alternate embodiment, a more sophisticated propagation model considering simultaneous switching is used:

$$a(y) = \sum_{i=1}^{n} P\left(\frac{\partial y}{\partial x_i}\right)\left(a(x_i) \prod_{\substack{j \neq i \\ 1 \leq j \leq n}} [1 - a(x_j)]\right) +$$

-continued $$\frac{1}{2}\left\{\sum_{1 \leq i < j \leq n}\left[P\left(\frac{\partial^2 y|_{00}}{\partial x_i \partial x_j}\right) + P\left(\frac{\partial^2 y|_{01}}{\partial x_i \partial x_j}\right)\right]\left(a(x_i)a(x_j) \prod_{l \in \{1,2,\ldots,n\} - \{i,j\}} [1 - a(x_l)]\right)\right\}$$

$$\frac{\partial^2 y|_{00}}{\partial x_i \partial x_j} \text{ and } \frac{\partial^2 y|_{01}}{\partial x_i \partial x_j}$$

wherein $a(y)$ is switching activity on output pin y and are second order Boolean differences that consider both input $x_i$ and $x_j$ switching simultaneously. The Boolean expression for their calculations are:

$$\frac{\partial^2 y|_{00}}{\partial x_i \partial x_j} = y|_{x_i=0,x_j=0} \oplus y|_{x_i=1,x_j=1}$$

$$\frac{\partial^2 y|_{01}}{\partial x_i \partial x_j} = y|_{x_i=0,x_j=1} \oplus y|_{x_i=1,x_j=0}$$

$P(x)$ represents the probability of the second order Boolean differences to have value 1.

As dynamic power is based on the sum of switching power and internal power, the switching power of one gate i is determined based on $$P_{sw}^i = \frac{1}{2} C_{load} V^2 SWA$$

wherein $C_{load}$ is the gate output loading capacitance; V is the gate supply voltage; and SWA is the gate output switching activity.

The internal power of one gate i is determined based on $$P_{int}^i = \sum_{j=1}^{n} PW_{table}(j) SWA_{ij}$$

wherein $PW_{table}(j)$ is an internal power table associated with timing arc from input j to the output of gate i; and $SWA_{ij}$ is part of the gate output switching activity assigned to each input based on equation (1). In the event the same input has multiple conditional arcs, each arc signal probability also may be applied during this internal power estimation.

In step (512), a statistical generated glitch power is determined. In one embodiment, starting from a design boundary like a flip-flop output, primary input (port), and/or gated clock output, a statistical engine calculates generated glitch toggles at all instance outputs. The generated glitches at an instance output are caused by functional toggles at its inputs. The output generated glitch values depend on:

$TC_{func}$ at its input pins, the leading and tailing pins in the glitch pattern;

cell delay from leading input pin to the output pin;

the arrival times at its input pins, the leading and tailing pins in the glitch pattern; and/or the Boolean function of the logic gate.

A pattern probability is referred to herein as the probability that an input glitch generating pattern $\omega_k$ occurs. $P_{patt}'(\omega_k)$ is the probability that two inputs toggling together, wherein considering two toggling inputs has traditionally been accurate enough. $P(\omega_{i,bias})$ is the probability that non-toggle inputs are biased such that the glitch may go through the gate:

$$P_{patt}(\omega_k) = P_{patt}'(\omega_k) \cdot P(\omega_{i,bias})$$

Assuming a glitch input pattern contains two inputs: a and b, then $$P'_{patt}(\omega_k) = \frac{D(a)/2}{f_{clk}} \cdot \frac{D(b)/2}{f_{clk}}$$

where D(x) is the switching activity of x, as described above.

Applying Boolean differential operations between the output pin and, for example, the two input ins in the glitch pattern for simple two-input gates with output Y and input A, B resolves to $$P(\omega_{i,bias}) = \frac{\partial^2 Y}{\partial A \partial B}$$

Taking the example of a 3-input NAND gate where $$Y = A \cdot B \cdot C, \left\{ \frac{\partial^2 Y}{\partial A \partial B} = \frac{\partial}{\partial A}\left(\frac{\partial Y}{\partial B}\right) = \frac{\partial}{\partial A}[(A \cdot 0 \cdot C) \oplus (A \cdot 1 \cdot C)] = \frac{\partial}{\partial A}(A \cdot C) = [(0 \cdot C) \oplus (1 \cdot C)] = (0 \oplus C) = C \right\}$$

$$\frac{\partial^2 Y}{\partial A \partial B} = C$$

Taking the example of a 3-input NOR gate where Y=A+B+C, $$\frac{\partial^2 Y}{\partial A \partial B} = \bar{C}$$

Taking the example of a 3-input XOR gate where Y=A⊕B⊕C, $$\frac{\partial Y}{\partial A} = \frac{\partial Y}{\partial B} = 1, \text{ force } P(\omega_{i,bias}) = 1$$

Returning to the second condition, that the interval time ζ between successive transitions at different inputs is larger than cell arc delay.

As described above, a generated glitch, generated by functional transitions, may occur under the condition that the interval time ζ between successive transitions at different inputs is larger than cell delay τ. The generation probability $P_{gen}(\omega_k)$ is referred to herein as the probability that input glitch generating pattern $\omega_k$ satisfies this condition, $$P_{gen}(\omega_k) = \iint_{A_k} f(\alpha)f(\beta)d\alpha d\beta$$

wherein α and β are the arrival times of the respective signals/inputs in $\omega_k$, f is the distribution function representing the number of transitions as a function of arrival time, and $A_k$ is the area that satisfies the condition that the interval time ζ between successive transitions at different inputs is larger than cell delay τ.

From analysis then, the generated glitch rate, $R_{gen}(i)$ is derived to be $$R_{gen}(i) = f_{clk} \sum_k \{P_{gen}(\omega_k) \cdot P_{patt}(\omega_k)\}$$

wherein $f_{clk}$ is clock frequency.

Figure 6:
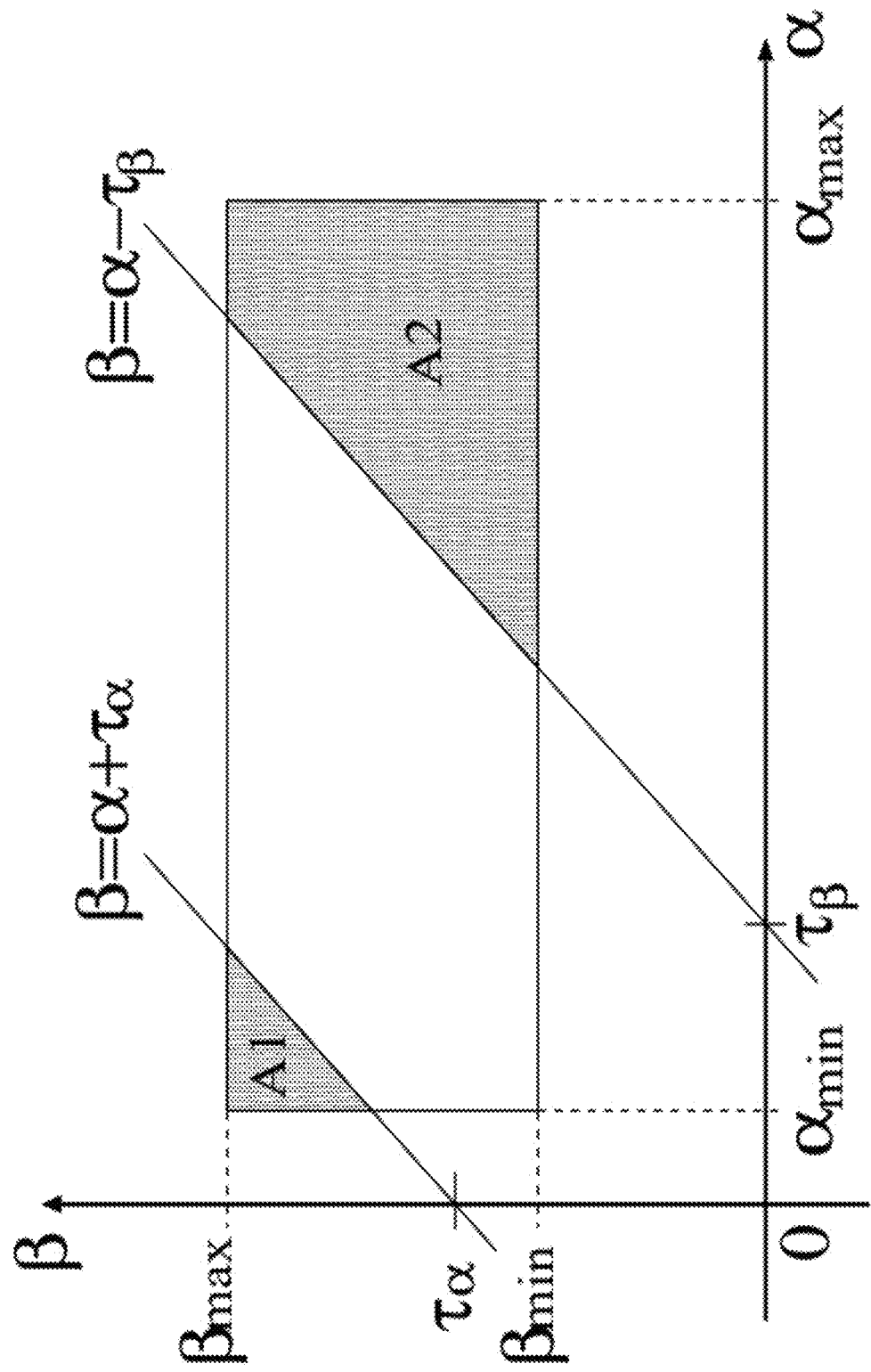
FIG. 6 is an illustration of a uniform distribution model to determine a generated glitch rate.

FIG. 6 is an illustration of a uniform distribution model to determine a generated glitch rate. Assuming a uniform distribution function in that the toggle may evenly occur with arrival window $$f(t) = \frac{1}{(\alpha_{max} - \alpha_{min})} \{U(t - \alpha_{min}) - U(t - \alpha_{max})\}$$

wherein $\alpha_{max}$ is the latest arrival time and $\alpha_{min}$ is the earliest arrival time (without OCV or On Chip Variation), and U is the step function/uniform distribution function. As shown in FIG. 6, the area "A1" represents the glitch pattern when pin A is leading edge (R), and the area "A2" represents the glitch pattern when pin B is leading edge (R).

Figure 7:
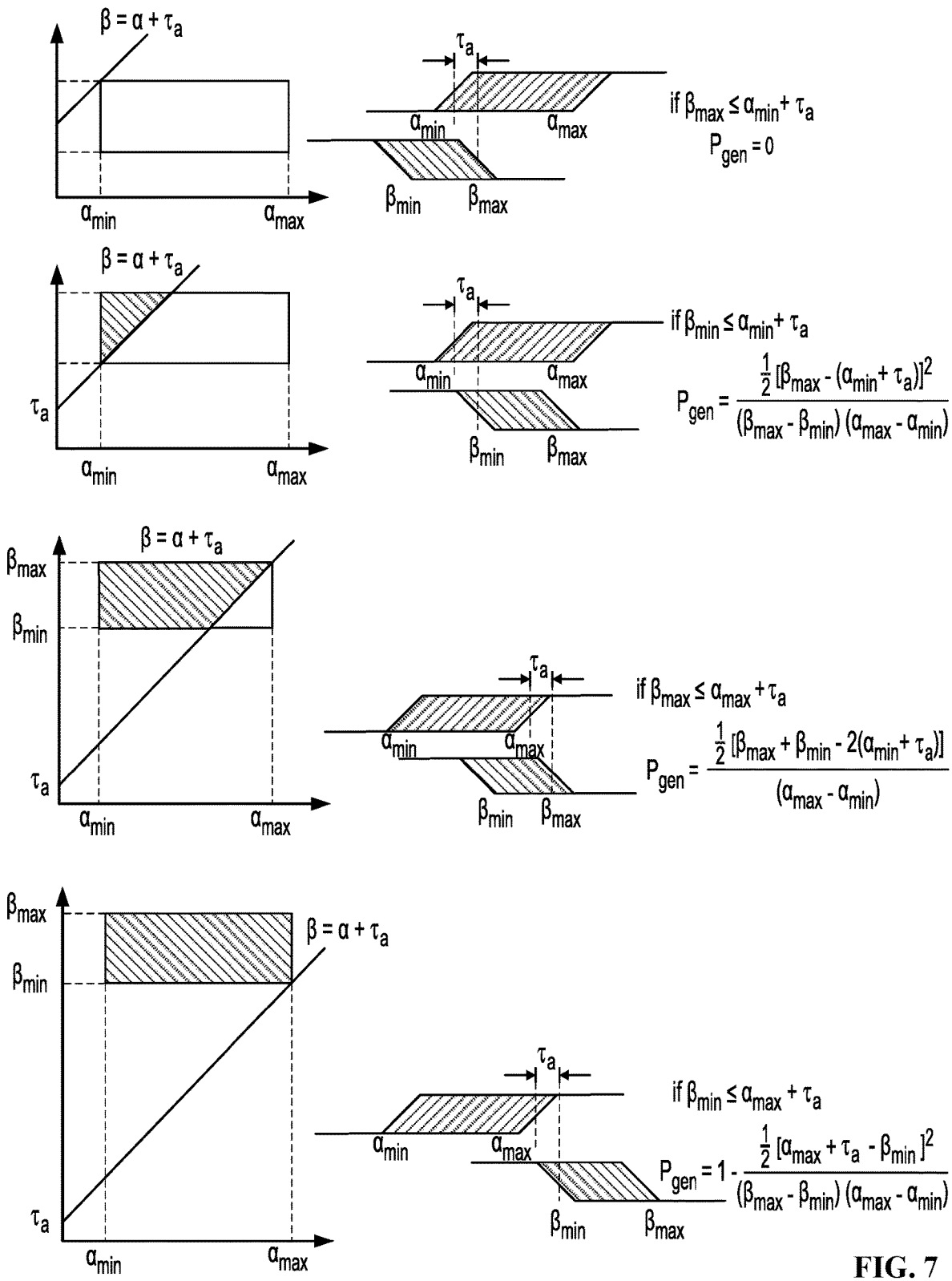
FIG. 7 is an illustration of a uniform distribution model surface integration analysis.
Figure 7:
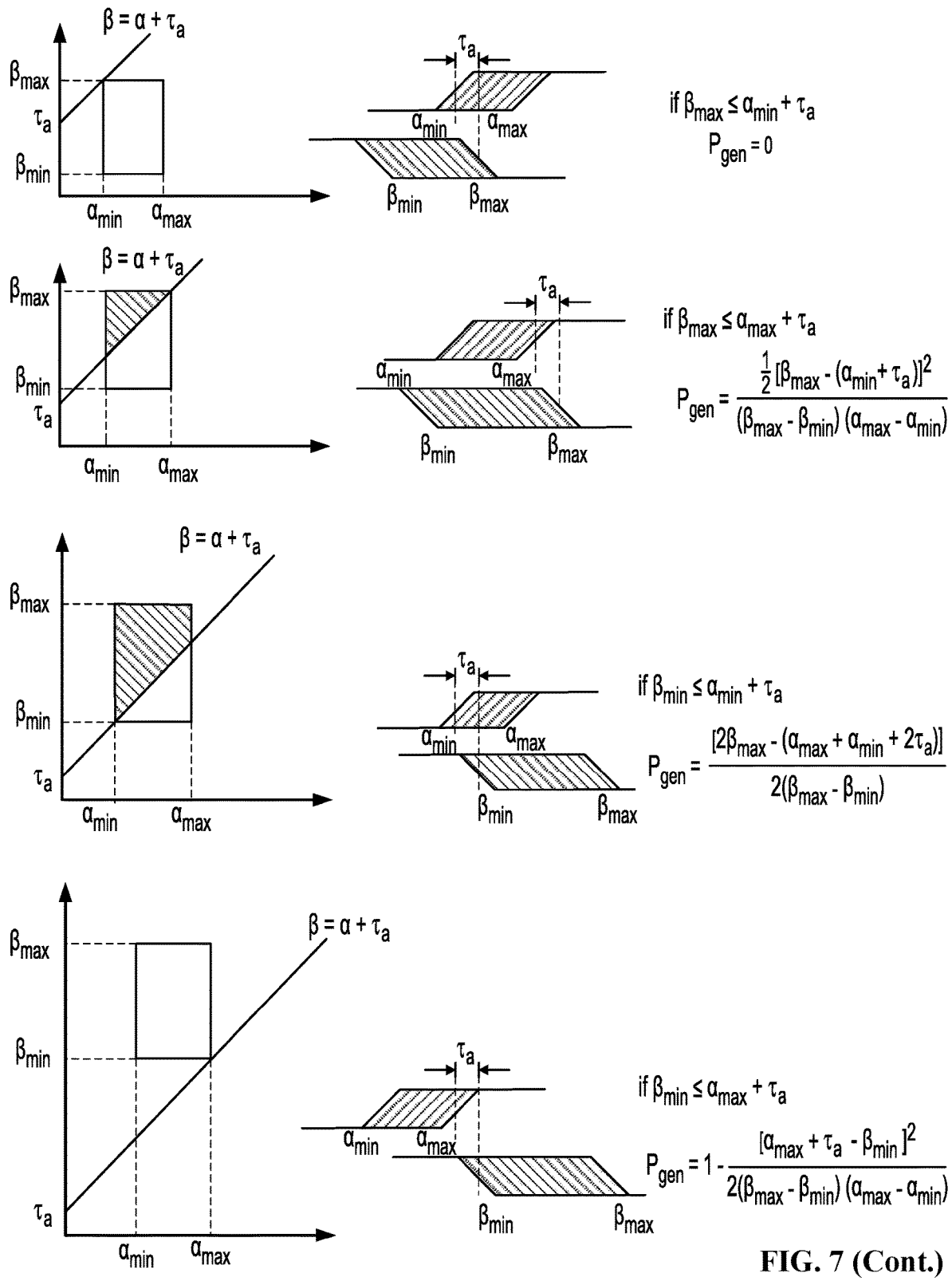

FIG. 7 is an illustration of a uniform distribution model surface integration analysis. As shown in FIG. 7 in various cases, for area A1:
  if $\beta_{max} \leq \alpha_{min} + \tau_a$, then $P_{gen} = 0$;
  if $\beta_{min} \leq \alpha_{min} + \tau_a$, then $$P_{gen} = \frac{\frac{1}{2}[\beta_{max} - (\alpha_{min} + \tau_a)]^2}{(\beta_{max} - \beta_{min})(\alpha_{max} - \alpha_{min})};$$

if $\beta_{max} \leq \alpha_{max} + \tau_a$, then and $$P_{gen} = \frac{\frac{1}{2}[\beta_{max} + \beta_{min} - 2(\alpha_{min} + \tau_a)]}{(\alpha_{max} - \alpha_{min})};$$

if $\delta_{min} \leq \alpha_{max} + \tau_a$, then $$P_{gen} = 1 - \frac{\frac{1}{2}[\alpha_{max} + \tau_a - \beta_{min}]^2}{(\beta_{max} - \beta_{min})(\alpha_{max} - \alpha_{min})}.$$

As shown in FIG. 7 in various cases, for area A2:
  if $\beta_{max} \leq \alpha_{min} + \tau_a$, then $P_{gen} = 0$;
  if $\beta_{max} \leq \alpha_{max} + \tau_a$, then $$P_{gen} = \frac{\frac{1}{2}[\beta_{max} - (\alpha_{min} + \tau_a)]^2}{(\beta_{max} - \beta_{min})(\alpha_{max} - \alpha_{min})};$$

if $\beta_{min} \leq \alpha_{min} + \tau_a$, then and $$P_{gen} = \frac{[2\beta_{max} - (\alpha_{max} + \alpha_{min} + 2\tau_a)]}{2(\beta_{max} - \beta_{min})};$$

if $\beta_{min} \leq \alpha_{max} + \tau_a$, then $$P_{gen} = 1 - \frac{[\alpha_{max} + \tau_a - \beta_{min}]^2}{2(\beta_{max} - \beta_{min})(\alpha_{max} - \alpha_{min})}.$$

Thus, to reduce the generated glitch rate, $R_{gen}(i)$, two main techniques are disclosed: gate sizing down in order to increase $\tau_a$, and adjusting the input arrival time to reduce the generation probability $P_{gen}$. In summary, using the analysis and assumption of a uniform distribution model described in FIG. 6 and FIG. 7, the statistical generated glitch power may be calculated as described above.

Returning to FIG. 5, in step (514), a statistical propagated glitch power is determined. The propagated glitches at a logic gate output is caused by glitch toggles at its input pins. One simplifying model assumes the inputs of gate have no correlation with each other; and/or there is sufficient time interval between the input transitions to calculate a simpler output propagating glitch rate as:

$$R(y) = \sum_{i=1}^{n} P\left(\frac{\partial y}{\partial x_i}\right) R(x_i)$$

Wherein $x_i$ is the i-th input of the gate, y is the output and n is the total number of inputs.

A more complex model considers that $R(x_i)$ is total glitch toggle rate at input $x_i$, $R(x_i) = R_{gen}(x_i) + R_{prop}(x_i)$ but this does not necessarily consider side input toggle impact to the propagated glitch value at output, which may overestimate propagated glitch. As described herein, "side input" is a related input of a given gate, so that the inputs of the gate are deterministic and/or statistically correlated. A more accurate algorithm may be developed to calculate propagated glitch that considers side input toggle impact, such as when multiple side inputs are switching simultaneously, which reduces the glitch propagation rate. The above equation $$"R(y) = \sum_{i=1}^{n} P\left(\frac{\partial y}{\partial x_i}\right) R(x_i)"$$

may not consider side input toggling impacts and tends to overestimate propagated glitch.

Preventing propagated glitch overestimation is disclosed herein by calculating the propagating glitch rate $R_{prop}$ on output y as $$R_{prop}(y) = \sum_{i=1}^{n} P\left(\frac{\partial y}{\partial x_i}\right) R(x_i) Beta(y, x_i)$$

wherein $$\left(\frac{\partial y}{\partial x_i}\right)$$

is the Boolean difference of output y with respect to $i_{th}$ input $x_i$, and $$P\left(\frac{\partial y}{\partial x_i}\right)$$

is the signal probability of the Boolean difference. $R(x_i)$ is the glitch rate of the gate's $i_{th}$ input $x_i$, $$R(x_i) = R_{gen}(x_i) + R_{prop}(x_i).$$

As more side inputs switch, less signal may be propagated. This effect is described herein as a "Side-Input Disturbance (SID)". As shown below, Beta(y, $x_j$) approximates SID using side-inputs correlated relationships, and is useful to determine signal activity on all side-input nodes of a Boolean function.

The computation resource requirement for an exact method using multiple-variable Boolean difference probability may grow exponentially with the number of independent side-inputs, and so the use of Beta replaces the computationally expensive calculation with multiple-level correlations to increase computation speed/reduce computational power without sacrificing significant accuracy:

$$Beta(y, x_i) = \prod_{j!=i}^{N} (1 - R(x_j)) + \frac{\beta_1 \sum_{j!=i}^{N}\left(R(x_j) \sum_{k!=i,j}^{N}(1 - R(x_k))\right)}{N(N-1)} +$$

$$\frac{\beta_2 \sum_{j!=i}^{N}\left(R(x_j) \prod_{k!=i,j}^{N}(1 - R(x_k))\right)}{N} - \frac{\beta_3 \sum_{j!=i}^{N}\left((1 - R(x_j)) \prod_{k!=i,j}^{N} R(x_k)\right)}{N}$$

In one embodiment, initially, the weighting coefficients $\beta_1$, $\beta_2$, and $\beta_3$ are set to 1.0. A single SID number is calculated using Beta(y, $x_1$) function and all the subscript j goes from 1 to N including the (j=i=1) variable. The SID number is applied to all arcs (logic arc from input $x_i$ to output y) of the Boolean function as a simplified approximation to calculate the $R_{prop}(y)$. The process stops here if no further weighting coefficients fine-tuning is required. The stopping criteria may be determined by comparing the calculated $R_{prop}(y)$ with golden number derived from, for example, VCD input or calculated using the exact method of multiple-variable Boolean difference probability from a number of digital gates.

If the result does not meet the criteria (e.g. accuracy threshold), then a self-tuned machine learning mechanisms may be applied to derive the weighting coefficients {β1, β3, β3}. In one embodiment, gradient descent, K-means clustering or simplified convolutionalneural networks (CNN) methods are applied to find a set of best fitted weighting coefficients for different gate groups, with improved $R_{prop}$ accuracy. Some of the results are served as a testing set. The training, the repeating of deriving and testing, is executed on the fly and stops once the stopping criteria can be satisfied. The weighting coefficients found are applied on the rest of the design. They may be stored in the database to be reused, and as a starting point to train other designs.

The value of Beta(y, $x_j$) of a single input gate (inverter, buffer) is 1 since there are no side-inputs to disturb. The Beta(y, $x_j$) of a two input gate (2-input NOR, NAND, XOR) can be reduced to $(1-R(x_j))$ where $x_j$ is the side-input. The Beta(y, $x_j$) of a three input gate (3-input NOR, NAND, XOR) may be reduced to $(1-0.5*(R(x_2)+R(x_3)))$ where $x_2$, $x_3$ are side-inputs and $x_1$ is the input calculated on.

The first term "$\Pi_{j!=i}^{N}(1-R(x_j))$" in the equation of Beta(y, $x_i$) above represents a first order approximation of SID. The sum approaches 0 when the side-input pin's toggle rate approaches 1, which indicates that no glitches may propagate through the gate. When none of the side-inputs is toggled ($R(x_j)=0$), SID becomes zero.

The second term $$\frac{\sum_{j!=i}^{N}\left(R(x_j)\sum_{k!=i,j}^{N}(1-R(x_k))\right)}{N(N-1)}$$

in the equation of Beta(y, $x_i$) above represents the correlation of the non-toggled side-inputs $1-(1-R(x_j))$ to its neighbors $(1-R(x_k))$, one at a time. The sum is normalized.

The third term $$\frac{\sum_{j!=i}^{N}\left(R(x_j)\prod_{k!=i,j}^{N}(1-R(x_k))\right)}{N}$$

in the equation of Beta(y, $x_i$) above represents the correlation of non-toggled side-inputs $1-(1-R(x_j))$ to their neighbors $(1-R(x_k))$, all at once. The sum is normalized.

$$\frac{\sum_{j!=i}^{N}\left((1-R(x_j))\prod_{k!=i,j}^{N}R(x_k)\right)}{N}$$

The fourth term in the equation of Beta(y, $x_i$) above compensates the double counting of the multiplication of non-toggled side-inputs. The sum is normalized. This prevents the $R_{prop}$ from being too pessimistic at the global level but may have a tendency of skewing the result towards optimistic on gates with many inputs.

In step (518), a glitch bottleneck ratio is determined. In one embodiment, the techniques described herein associated with FIG. 3 are used to determine the glitch bottleneck ratio.

In one embodiment, an incremental TC and TG calculation is used. If $TC_{anno}$ is a total toggle count and $TG_{anno}$ is a total glitch edges in AP, which are calculated after a file like a VCD file is imported. $TC_{anno}$ and $TG_{anno}$ are updated in an incremental timing update based on a $TG_{stat}$ change from the statistical engine:

$$TG_{anno}^{new} = \left(\frac{TG_{stat}^{new}}{TG_{stat}^{base}}\right) * TG_{anno}^{base} = TG_{stat}^{new} \times TG_{AdjRatio}$$

wherein $TG_{stat}^{new}$ is the new statistical glitch count, and $TG_{stat}^{base}$ is the statistical glitch count before the incremental optimization change:

$$TC_{anno}^{new} = (TC_{anno}^{orig} - TG_{anno}^{orig}) + TG_{anno}^{new}$$

Figure 8:
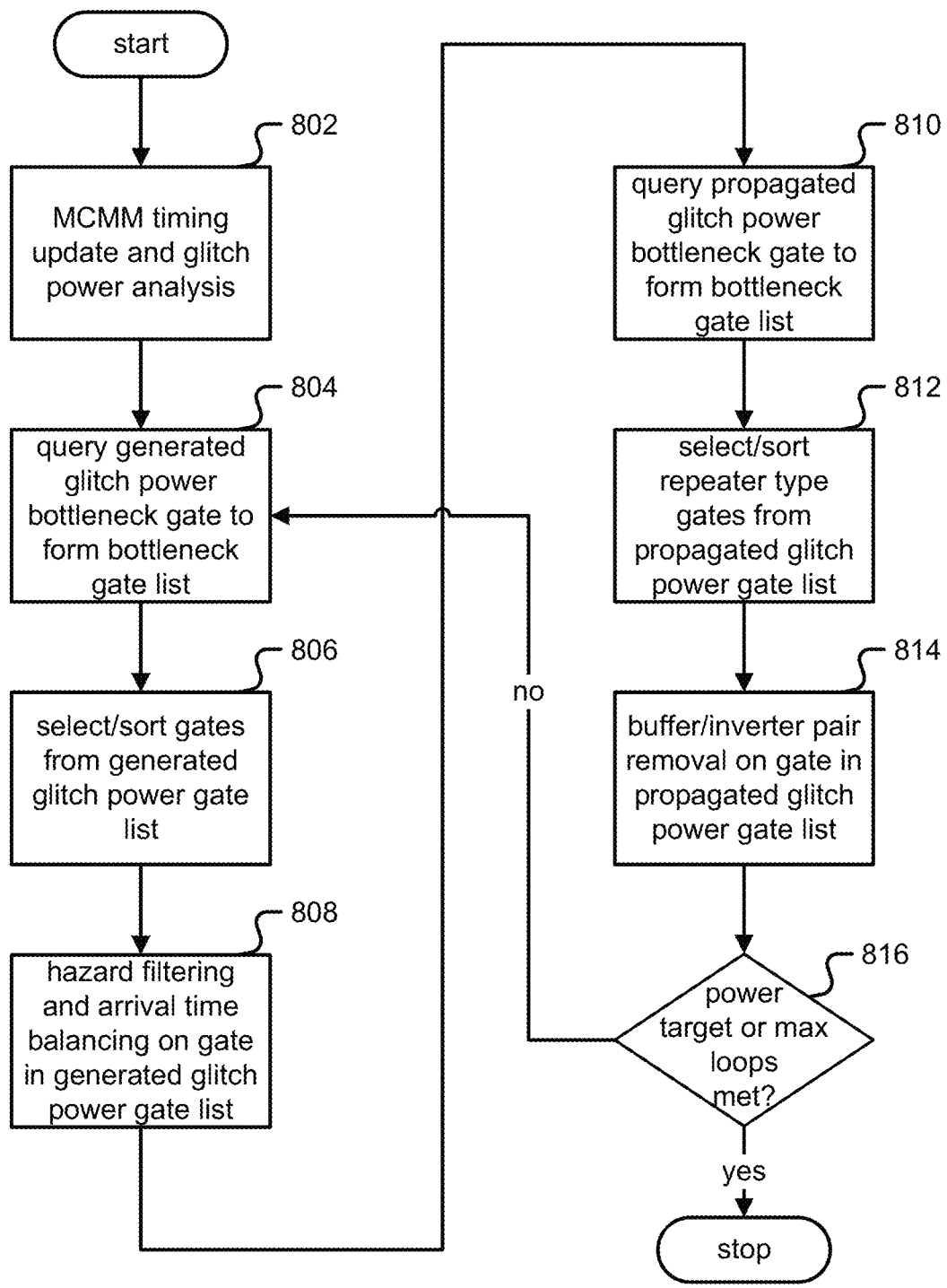
FIG. 8 is a flow chart illustrating an embodiment of a process for glitch power optimization.

FIG. 8 is a flow chart illustrating an embodiment of a process for glitch power optimization. In one embodiment, the process of FIG. 8 is carried out by the system of FIG. 1. Optimization is one application of the dynamic power analysis of FIG. 5. Reducing the glitch power consumption commences with a determination of bottleneck gates through an MCMM (Multi-Corner Multi-Mode) based bottleneck glitch power analysis query. For each selected gate, performing optimization techniques including gate sizing and repeater removal to reduce glitch power while checking timing and other design QoR (Quality of Results) metrics.

In step (802), a timer performs MCMM timing update and calculates glitch power of the design. In step (804), an optimizer queries generated glitch power bottleneck driver pins through a timer's glitch power analysis function. In step (806), the optimizer selects gates with an upper bound for power consumption greater than a predetermined threshold value. The optimizer selects optimizable candidate gates to put into a gate list and sorts the gate list by timing criticality.

During step (808), for each selected candidate gate the optimizer uses hazard filtering and arrival timing balancing techniques to reduce generated glitch power through the gate. In hazard filtering, gate propagation delays are adjusted to filter out glitches through the gate. A gate is replaced by a logically equivalent but different sized cell so that a delay of the gate is changed. The optimizer uses gate upsizing and gate downsizing techniques to balance arrival time through the gate.

In step (810), after optimization for generated glitch power reduction, a timer performs bottleneck-based propagated glitch power analysis. In step (812), the optimizer selects repeater type gates from bottleneck-based gates with propagated glitch power, and sorts them with timing criticality. These candidate gates are put into a gate list for propagated glitch power reduction. In step (814), propagated glitch power is reduced in part by applying buffer removal and/or inverter pair merge/removal.

In step (816), in the event glitch power reduction meets a target or the process hits the maximum/threshold number of loops, control is ended; otherwise, control is transferred back to step (804) for another loop.

Figure 9:
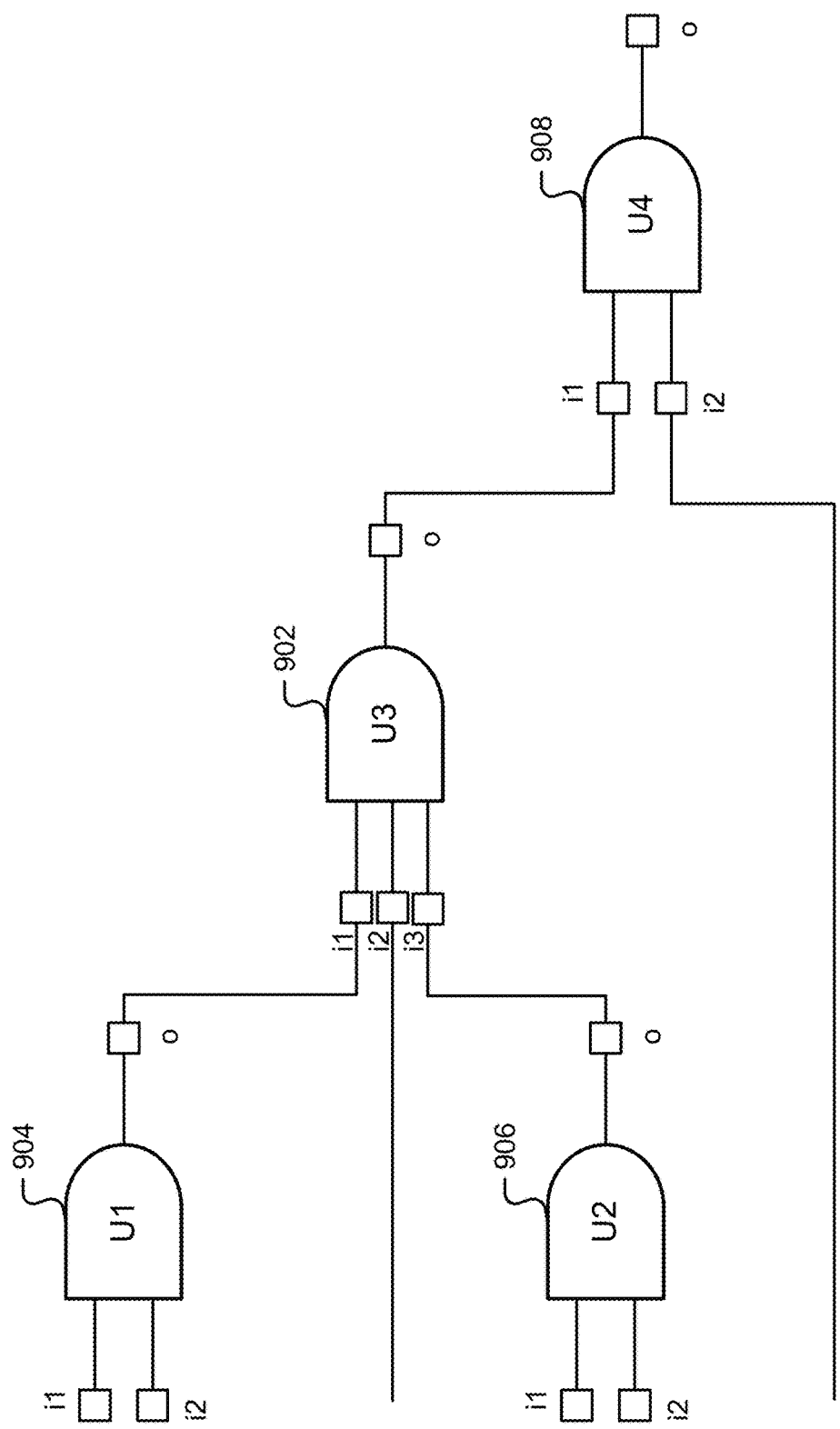
FIG. 9 is an illustration of optimization techniques to reduce generated glitch power.

FIG. 9 is an illustration of optimization techniques to reduce generated glitch power. In the example of FIG. 9, a candidate gate is U3 (902). For generated glitch power reduction, a hazard filtering technique is used to increase the delay of gate U3 (902) to such an extent so that the glitch is eliminated and hence generated glitch power on gate U3 (902) is eliminated.

The same may be used for generated glitch power reduction, and an arrival timing balancing technique is used for resolving differing path delays. Upsizing gate U1 (904) with slower path delay or downsizing gate U2 (906) with faster path delay may reduce glitching transition so that the generated glitch power is reduced.

If gate U3 (902) is a buffer type, then it may be removed to eliminate its propagated glitch power if there is no QoR degradation. If gate U3 (902) is an inverter type and gate U4 (908) is also an inverter type, then gate U3 (902) and gate U4 (908) may be merged or removed for generated power reduction.

Figure 10A:
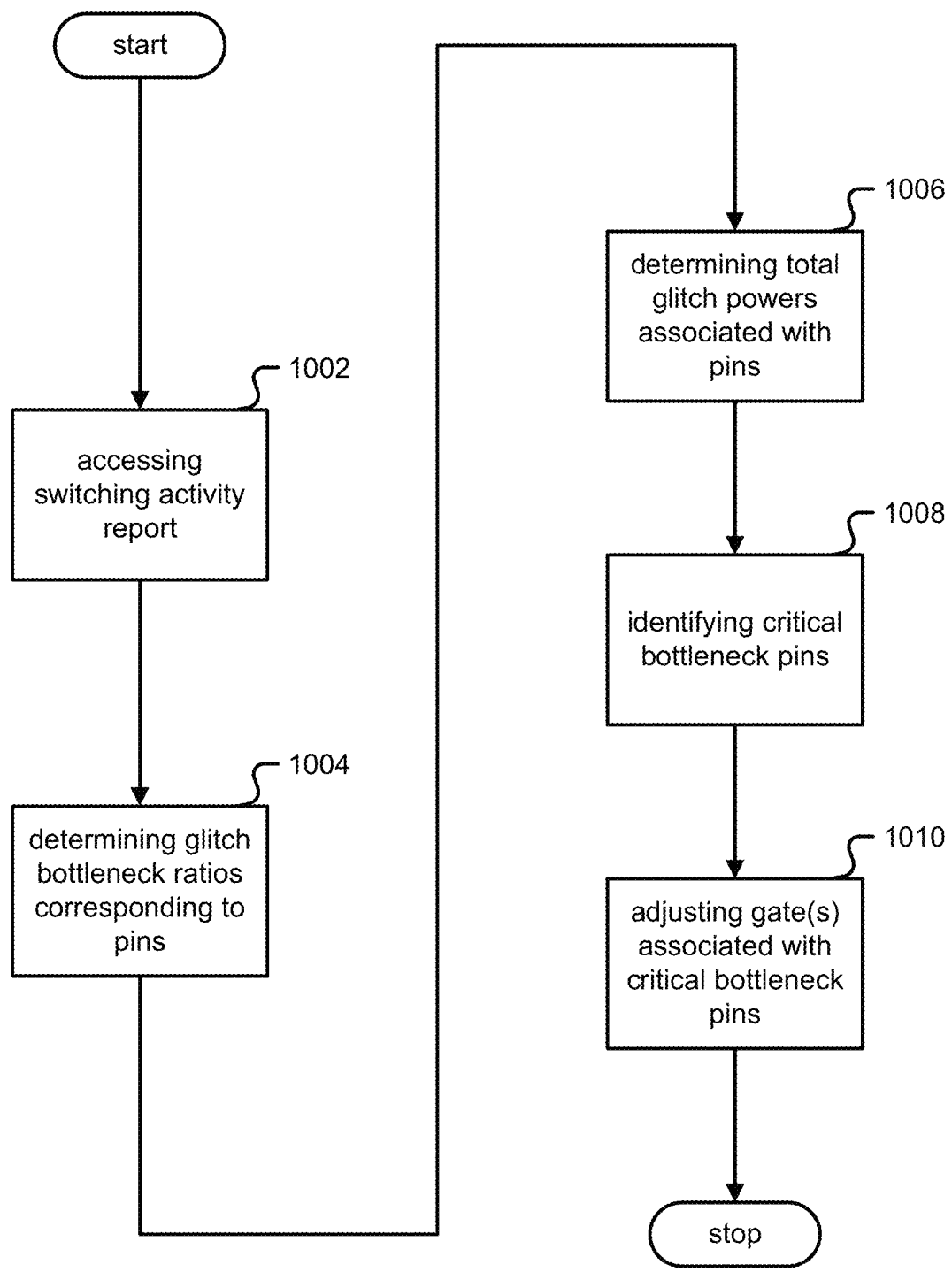
FIG. 10A is a flow chart illustrating an embodiment of a process for glitch power analysis.

FIG. 10A is a flow chart illustrating an embodiment of a process for glitch power analysis. In one embodiment, the process of FIG. 10A is carried out by the system of FIG. 1.

In step (1002), a switching activity report of simulated switching activities of a semiconductor circuit is accessed. For example, a switching activity report may be and/or includes a VCD file. In one embodiment, accurate glitch toggle information is determined based at least in part on the switching activity report. Accurate glitch toggle information may be based at least in part on an annotation engine analysis of the switching activity report.

In one embodiment, boundary pin toggling information is used to determine statistical glitch toggle information. Boundary pins as described herein are the input pins and output pins of registers. In one embodiment, statistical glitch toggle information is based at least in part on a statistical engine estimate such as $TG_{stat}$ described above. In one embodiment, parameters associated with side-input disturbance are determined using machine learning. In one embodiment, side-input disturbance is accounted for using a first-order approximation, for example as described above. In one embodiment, side-input disturbance is accounted for using a correlation of non-toggled side inputs, for example as described above.

In one embodiment, accurate glitch toggle information is determined based on the switching activity report, boundary pin toggling information is used to determine statistical glitch toggle information, and a calibration ratio is determined. In one embodiment, a calibration ratio is applied to the statistical glitch toggle value, for example as described above $TG\_AdjRatio=TG_{anno}/TG_{stat}$.

In one embodiment, a plurality of glitch counts corresponding to a plurality of gate output pins from the switching activity report are extracted and a plurality of accurate glitch powers based on the plurality of glitch counts determined. In one embodiment, a plurality of glitch powers corresponding to the plurality of pins is determined.

In one embodiment, updated statistical glitch toggle information is determined incrementally based on the adjustment, applying the calibration ratio to the updated statistical glitch toggle information.

In step (1004), a plurality of glitch bottleneck ratios corresponding to a plurality of pins in the semiconductor circuit is determined, as described in more detail below in FIG. 10B In step (1006), a plurality of total glitch powers associated with the plurality of pins is determined, wherein each total glitch power of the plurality of total glitch powers being determined based on a glitch bottleneck ratio and a glitch power of a corresponding pin. In one embodiment, the total glitch power is based at least in part on a function of the glitch bottleneck ratio multiplied by the glitch power of the corresponding pin. In one embodiment, the glitch power of the corresponding pin is based at least in part on one of the following: a generated glitch power for the corresponding pin and a propagated power for the corresponding pin.

In step (1008), one or more critical bottleneck pins among the plurality of pins is identified based on the plurality of total glitch powers. In optional step (1010), one or more gates associated with the one or more critical bottleneck pins is adjusted to reduce corresponding one or more total glitch powers of the one or more gates. In one embodiment, the adjusting of the one or more gates includes one or more of: balancing the signal toggling time at gate inputs; changing gate delay; making a gate delay larger; applying glitch filtering; and/or changing clock latency of a clock tree. An optimizer such as Aprisa™ by Avatar Integrated Systems can be used to perform step (1008) and/or step (1010).

Figure 10B:
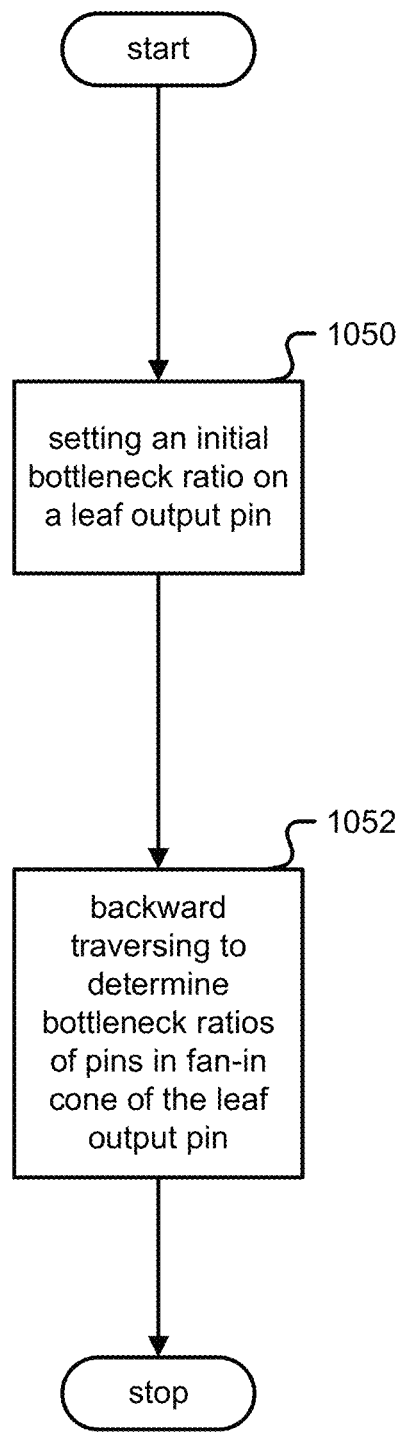
FIG. 10B is a flow chart illustrating an embodiment of a process for determining glitch bottleneck ratios corresponding to pins.

FIG. 10B is a flow chart illustrating an embodiment of a process for determining glitch bottleneck ratios corresponding to pins. In one embodiment, the process of FIG. 10B is part of step (1004) in FIG. 10A and carried out by the system of FIG. 1.

In step (1050) an initial bottleneck ratio is set on a leaf output pin, for example pin (302) at the output of gate U4 (304) in FIG. 3. In step (1052) the semiconductor circuit is backward traversed to determine a plurality of glitch bottleneck ratios of pins in a fan-in cone of the leaf output pin, for example in FIG. 3 the fan-in cone of pin (302) includes pins associated with gate U2 (306) and U1 (308).

A dual glitch power analysis engine has been disclosed. A dual glitch power analysis engine calculates accurate glitch power value and incrementally updates design glitch power during, for example, an implementation/P&R flow. One of the two engines is an annotation engine which extracts information from, for example, a VCD file and annotates accurate glitch toggle information from the dynamic simulation that produced the file. The other of the two engines is a statistical engine which uses boundary pin toggling information. One benefit of this practical dual glitch power analysis engine is improved analysis and optimization on reducing dynamic power during circuit design and implementation. For the target design this may improve battery life, reduce heat and/or thermal noise, improve power efficiency, reduce power requirements, and reduce weight/size of a product associated with the target design.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, including:
    accessing a switching activity report of simulated switching activities of a semiconductor circuit;
    determining a plurality of glitch bottleneck ratios corresponding to a plurality of pins in the semiconductor circuit, comprising by:
        setting an initial bottleneck ratio on a leaf output pin; and
        backward traversing the semiconductor circuit to determine a plurality of glitch bottleneck ratios of pins in a fan-in cone of the leaf output pin;
    determining a plurality of total glitch powers associated with the plurality of pins, a total glitch power of the plurality of total glitch powers being determined based on a glitch bottleneck ratio and a glitch power of a corresponding pin;
    identifying one or more critical bottleneck pins among the plurality of pins based on the plurality of total glitch powers; and
    adjusting one or more gates associated with the one or more critical bottleneck pins to reduce corresponding one or more total glitch powers of the one or more gates.

2. The method of claim 1, wherein the total glitch power of the plurality of total glitch powers is based at least in part on a function of the glitch bottleneck ratio multiplied by the glitch power of the corresponding pin.

3. The method of claim 1, wherein the glitch power of the corresponding pin is based at least in part on a generated glitch power for the corresponding pin, a propagated power for the corresponding pin, or both.

4. The method of claim 1, wherein the switching activity report includes a VCD (value change dump) file.

5. The method of claim 1, further comprising determining accurate glitch toggle information based on the switching activity report.

6. The method of claim 5, wherein accurate glitch toggle information is based at least in part on an annotation engine analysis of the switching activity report.

7. The method of claim 1, further comprising using boundary pin toggling information to determine statistical glitch toggle information.

8. The method of claim 7, wherein statistical glitch toggle information is based at least in part on a statistical engine estimate.

9. The method of claim 7, wherein the statistical glitch toggle information is determined accounting for side-input disturbance.

10. The method of claim 9, wherein parameters associated with side-input disturbance are determined using machine learning.

11. The method of claim 9, wherein side-input disturbance is accounted for using a first-order approximation.

12. The method of claim 9, wherein side-input disturbance is accounted for using a correlation of non-toggled side inputs.

13. The method of claim 1, further comprising: determining accurate glitch toggle information based on the switching activity report; using boundary pin toggling information to determine statistical glitch toggle information; and determining a calibration ratio.

14. The method of claim 1, further comprising applying a calibration ratio to a statistical glitch toggle value.

15. The method of claim 1, further comprising extracting a plurality of glitch counts corresponding to a plurality of gate output pins from the switching activity report and determining a plurality of accurate glitch powers based on the plurality of glitch counts.

16. The method of claim 1, further comprising determining a plurality of glitch powers corresponding to the plurality of pins.

17. The method of claim 1, wherein the adjusting of the one or more gates includes one or more of: balancing a signal toggling time at gate inputs; changing gate delay; making a gate delay larger; applying glitch filtering; and changing clock latency of a clock tree.

18. The method of claim 1, further comprising determining updated statistical glitch toggle information incrementally based on the adjustment, applying a calibration ratio to the updated statistical glitch toggle information.

19. A system, comprising:
a processor configured to:
  access a switching activity report of simulated switching activities of a semiconductor circuit;
  determine a plurality of glitch bottleneck ratios corresponding to a plurality of pins in the semiconductor circuit, comprising by:
  set an initial bottleneck ratio on a leaf output pin;
  backward traverse the semiconductor circuit to determine a plurality of glitch bottleneck ratios of pins in a fan-in cone of the leaf output pin;
  determine a plurality of total glitch powers associated with the plurality of pins, a total glitch power of the plurality of total glitch powers being determined based on a glitch bottleneck ratio and a glitch power of a corresponding pin;
  identify one or more critical bottleneck pins among the plurality of pins based on the plurality of total glitch powers; and
  adjust one or more gates associated with the one or more critical bottleneck pins to reduce corresponding one or more total glitch powers of the one or more gates; and
a memory coupled to the processor and configured to provide the processor with instructions.

20. A computer program product, the computer program product being embodied in a non-transitory computer readable storage medium and comprising computer instructions for:
accessing a switching activity report of simulated switching activities of a semiconductor circuit;
determining a plurality of glitch bottleneck ratios corresponding to a plurality of pins in the semiconductor circuit, comprising by:
setting an initial bottleneck ratio on a leaf output pin;
backward traversing the semiconductor circuit to determine a plurality of glitch bottleneck ratios of pins in a fan-in cone of the leaf output pin;
determining a plurality of total glitch powers associated with the plurality of pins, a total glitch power of the plurality of total glitch powers being determined based on a glitch bottleneck ratio and a glitch power of a corresponding pin;
identifying one or more critical bottleneck pins among the plurality of pins based on the plurality of total glitch powers; and
adjusting one or more gates associated with the one or more critical bottleneck pins to reduce corresponding one or more total glitch powers of the one or more gates.

* * * * *